United States Patent
Hattass et al.

(10) Patent No.: US 9,650,240 B2
(45) Date of Patent: May 16, 2017

(54) COMPONENT INCLUDING TWO SEMICONDUCTOR ELEMENTS, WHICH ARE BONDED TO ONE ANOTHER VIA A STRUCTURED BONDING LAYER, AND METHOD FOR MANUFACTURING A COMPONENT OF THIS TYPE

(71) Applicant: Robert Bosch GmbH, Stuttgart (DE)

(72) Inventors: Mirko Hattass, Stuttgart (DE); Heiko Stahl, Reutlingen (DE); Jochen Reinmuth, Reutlingen (DE); Julian Gonska, Reutlingen (DE); Johannes Classen, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 14/730,912

(22) Filed: Jun. 4, 2015

(65) Prior Publication Data

US 2015/0353349 A1    Dec. 10, 2015

(30) Foreign Application Priority Data

Jun. 6, 2014    (DE) .................... 10 2014 210 852

(51) Int. Cl.
| | |
|---|---|
| H01L 21/44 | (2006.01) |
| B81C 1/00 | (2006.01) |
| B81B 7/00 | (2006.01) |
| B81C 3/00 | (2006.01) |

(52) U.S. Cl.
CPC .......... *B81C 1/00269* (2013.01); *B81B 7/007* (2013.01); *B81C 3/001* (2013.01); *B81C 2203/0118* (2013.01); *B81C 2203/035* (2013.01); *B81C 2203/054* (2013.01)

(58) Field of Classification Search
None
See application file for complete search history.

(56) References Cited

U.S. PATENT DOCUMENTS

| | | | | |
|---|---|---|---|---|
| 2002/0119597 A1* | 8/2002 | Mastromatteo | ..... | B81C 1/00269 438/107 |
| 2010/0181676 A1* | 7/2010 | Montez | ...... | B81C 1/00269 257/771 |
| 2015/0266726 A1* | 9/2015 | Gudeman | ......... | B81C 1/00269 438/121 |

* cited by examiner

*Primary Examiner* — Ali Naraghi
(74) *Attorney, Agent, or Firm* — Norton Rose Fulbright US LLP

(57) ABSTRACT

Measures are provided for improving and simplifying metallic bonding processes which enable a reliable initiation of the bonding process and thus contribute to a uniform bonding. The present method provides a further option for using bonding layers. The method in the case of which the two semiconductor elements are bonded to one another via a bond of at least one metallic starting layer and at least one further starting layer provides that the two starting layers are structured in such a way that the layer areas which are assigned to one another have differently sized areal extents. Moreover, the layer thicknesses of the two starting layers should be selected in such a way that the layer areas which are assigned to one another meet the material ratio necessary for the bonding process.

6 Claims, 6 Drawing Sheets

COMPONENT INCLUDING TWO SEMICONDUCTOR ELEMENTS, WHICH ARE BONDED TO ONE ANOTHER VIA A STRUCTURED BONDING LAYER, AND METHOD FOR MANUFACTURING A COMPONENT OF THIS TYPE

FIELD OF THE INVENTION

The present invention relates to a component including at least two semiconductor elements, which are bonded to one another via a structured bonding layer, this bonding layer being formed from at least one structured starting layer made of a metallic layer material and at least one further structured starting layer whose layer materials have been bonded in a bonding process under the application of pressure. Furthermore, the present invention relates to a method for manufacturing a component of this type.

BACKGROUND INFORMATION

Bonds are used, for example, for constructing vertical hybrid integrated components. Components of this type generally include multiple MEMS and/or ASIC elements whose element functions complement each other. Vertical hybrid integrated sensor components which include a MEMS element and an ASIC element are important in particular. The micromechanical structure of the MEMS element is used to detect a measured variable which is converted into an electrical measuring signal with the aid of circuit elements of the MEMS element. These measuring signals are then processed and, if necessary, evaluated using the circuit functions of the ASIC element.

The elements of a vertical hybrid integrated component are situated above one another in the form of a chip stack and are bonded to one another in such a way that further repackaging for the second level assembly on an application circuit board is not necessary. For this purpose, the mechanical connection between the individual elements must, on the one hand, be permanently stable and, on the other hand, also circumferentially tightly closed in order to protect the element functions against harmful environmental influences, e.g., dust particles, moisture, and gases.

During the manufacture of vertical hybrid integrated components, the individual element components are not only generally produced in the wafer composite. Their assembly also takes place in the wafer composite during a wafer bonding process. The components are frequently even separated only after testing and calibration at the end of the manufacturing process.

In practice, wafer bonding processes are mostly employed during which one or also both element surface(s) or wafer surface(s) to be bonded are provided with a structured bonding layer. These bonding processes include glass frit bonding, during which low melting lead glass is used as the bonding layer, and metallic bonding processes, such as the thermocompression bonding processes Au—Au bonding, Cu—Cu bonding and Al—Al bonding, eutectic bonding processes Au—Si bonding, Al—Ge bonding, Al—Au bonding, and Al—Si bonding as well as solid-liquid interdiffusion (SLID) bonding involving Cu/Sn and Au/Sn.

Since the glass frit technique requires a relatively large chip area in order to ensure a hermetically sealed and permanently stable bond, metallic bonding processes are increasingly used. Although the space requirement for a hermetically sealed and mechanically solid connection is considerably smaller with this technique, it imposes significantly higher requirements on the wafer surfaces to be bonded, in particular on their planarity and purity. Since the wafer bond is established in this case with the aid of interdiffusion or by fusion of the bonding areas, the latter must be brought into intimate contact. For this purpose, very high contact pressures in the magnitude of up to 100 kN are applied during the entire bonding process and onto the entire bonding area.

SUMMARY OF THE INVENTION

The present invention provides measures for improving and simplifying metallic bonding processes which enable a reliable initiation of the bonding process and thus contribute to a uniform bonding. Moreover, the present invention provides a further option for using bonding layers.

The measures according to the present invention involve layout suggestions for the two starting layers which are converted into the bonding layer between the two elements during the bonding process.

Thus, the method for manufacturing a component including at least two semiconductor elements provides that the two starting layers are structured in such a way that the layer areas which are assigned to one another have differently sized areal extents. Moreover, the layer thicknesses of the two starting layers should be selected in such a way that the layer areas which are assigned to one another meet the material ratio necessary for the bonding process.

The present invention accordingly provides an asymmetric or noncongruent layout of the two starting layers for the bond. In this way, the contact area between the bonding materials is relatively small at the beginning of the bonding process. The applied pressure is accordingly relatively great at a given contact force, thus favoring the breaking-up of potentially present oxides and/or contaminants on the bonding surfaces and therefore ensuring the beginning of the bonding process. Alternatively, the contact force may also be reduced for this purpose as long as the minimum pressure necessary for the bonding process is applied at least on the contact point. In the course of the bonding process, the bond front expands laterally, which is accompanied by a height reduction of the two starting layers and is associated with an additional, vertical pulling effect. This pulling effect supports the contact force and facilitates a uniform compression and bonding of the layer materials.

There are in principle many different possibilities for implementing the bonding concept according to the present invention. The layout of the starting layers for the bonding process, for example, also always depends on the type and function of the two elements to be bonded to one another. The various forms of implementation, however, do not only relate to the layout and thickness of the two starting layers, but also to the application of the layer material and the topography of the starting layers.

The implementation of the different layouts for the two starting layers of the bonding process is particularly easy, when each one of the two element surfaces to be bonded is provided with a starting layer for the bonding process. Depending on the topography of the two element surfaces to be bonded, it may also be meaningful to apply both starting layers to one of the two element surfaces to be bonded. In this case, the first starting layer must then be structured prior to the application of the other starting layer.

Depending on the size and shape of the bonding area between the elements, it may prove advantageous to assign to one contiguous layer area in the one starting layer multiple layer areas of the other starting layer. This procedure is suitable, in particular, for bonding areas which are not planarly closed, such as a circumferential bond frame.

Depending on the layer material, the layer areas of the two starting layers may also be provided with a topography in order to thus influence the contact pressure in a targeted manner in the course of the bonding process at a given contact force and to distribute it in a suitably planar manner.

It has furthermore been recognized according to the present invention that the noncongruent design of the layout of the two starting layers may be used for implementing structural elements having further functions such as an electrode or a standoff structure. A structural element of this type may be, as a matter of fact, easily structured out of one of the two starting layers next to the bonding area. The structural element, however, cannot be assigned a layer area in the other respective starting layer, so that a bond cannot form here during the bonding process.

With the aid of a standoff structure of this type, it is very easily possible to delimit the thickness of the bonding layer, for example. However, it may also be used as a stop for a deflectable micromechanical structural component of one of the two elements. An electrode may be used depending on the application for signal detection or activation of micromechanical structural elements.

As explained above, there are various possibilities of implementing and refining the present invention in an advantageous manner. For this purpose, reference is made, on the one hand, to the further subject matter which is subordinate to the main subject matter described herein, and, on the other hand, to the following description of multiple exemplary embodiments of the present invention on the basis of the figures.

DETAILED DESCRIPTION

In the exemplary embodiment illustrated in FIGS. 1a through 1e, the surfaces of the two elements 10 and 20 to be bonded are each provided with a starting layer, at least one of these starting layers being made of a metallic layer material. The exemplary embodiment refers to the eutectic material combination aluminum-germanium, but may also be transferred to other material systems such as gold-tin or gold-silicon. The layer materials of the two starting layers are supposed to bond during the bonding process, forming one bonding layer 30 for the two elements 10 and 20. For many applications, the elements are supposed to be bonded to one another only in a subarea of the element surfaces, for example across a bond frame. For this purpose, the starting layers are structured even prior to the actual bonding process.

Figure 1A:
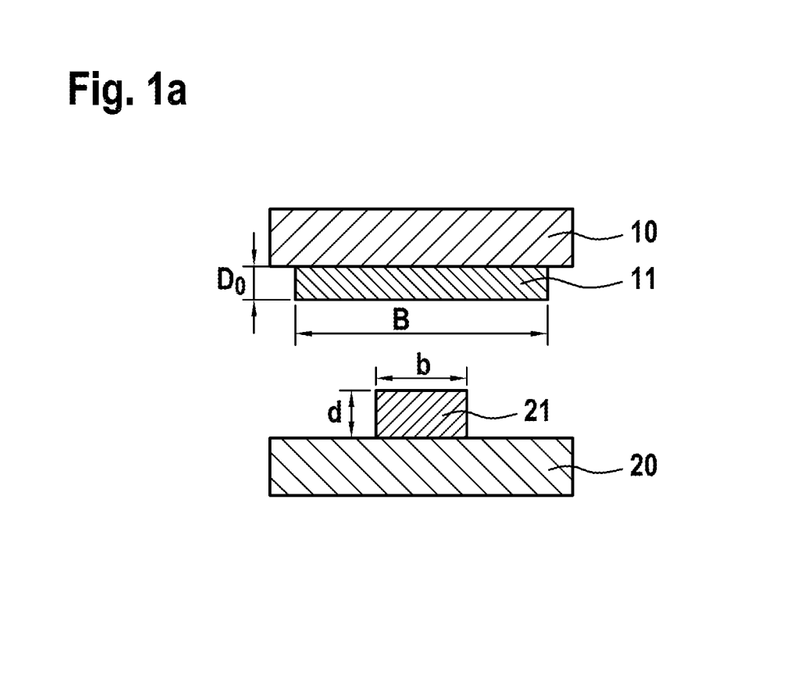
FIGS. 1a through 1e show the bonding concept according to the present invention based on schematic sectional representations of two elements 10 and 20 during the bonding process.

In the exemplary embodiment described here, a layer area 11, the areal extent of which essentially corresponds to the strived for bonding area, was structured out of the starting layer of element 10. Layer area 11 is assigned a layer area 21 in the starting layer of element 20, the areal extent of which is considerably smaller than that of layer area 11. In turn, the starting layer of element 20 is, however, thicker than the starting layer of element 10 so that the quantitative ratio of the layer materials necessary for the eutectic bonding process is met. FIG. 1a illustrates these proportions as well as the configuration of the two layer areas 11 and 21 with regard to one another. Layer area 11 has a thickness D0. Its diameter is identified by B. Since B also corresponds to the diameter of the bonding area to be generated, this parameter is predefined by the required stability of the bond. The effective contact pressure which acts on the contact area at least at the beginning of the bonding process at a given contact pressure may be influenced via diameter b of smaller layer area 21. The smaller b is selected to be, the greater is the local contact pressure. Thickness d of layer area 21 must then be selected in such a way that a sufficient amount of layer material is available for the eutectic bond. Since thickness d is also a function of the areal extent and thus of b, b also determines the vertical shrinkage of the bond during the bonding process and thus the vertical "pull" which is applied to elements 10 and 20 in the process.

Figure 1B:
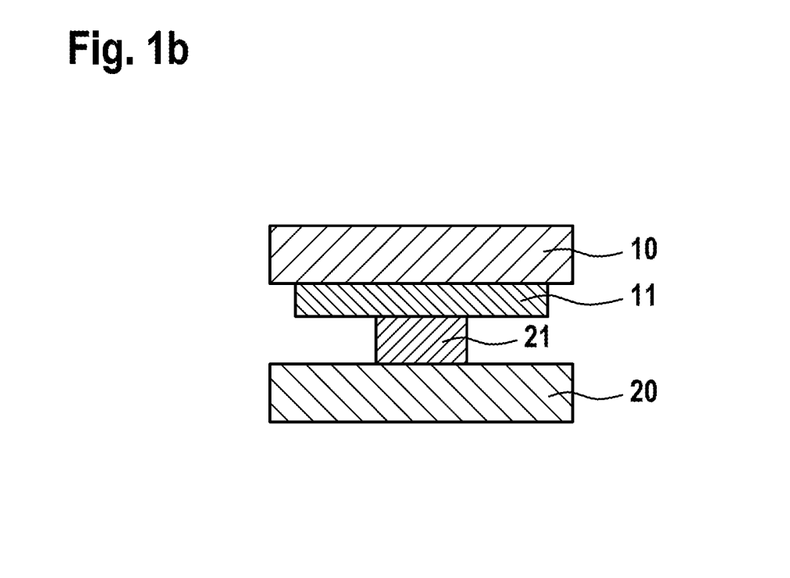

The two elements 10 and 20 are brought into contact for the bonding process, which is illustrated in FIG. 1b. The bonding reaction has not started yet because the process temperature is still below the eutectic point, for example. The distance between elements 10 and 20 corresponds to the sum of the two layer thicknesses D0+d. The contact area corresponds to the area of layer area 21 and has diameter b. The smaller b is, the smaller is also the contact area and the larger is the contact pressure at the beginning of the bonding process at a given contact force. The comparably high contact pressure supports the targeted start of the bonding process if the conditions required therefor are met, i.e., the eutectic temperature is reached, for example. The higher the contact pressure, the easier it is to break through the bothersome layers on the bond surfaces which impede the bonding process such as surface oxides or contaminations.

Figure 1C:
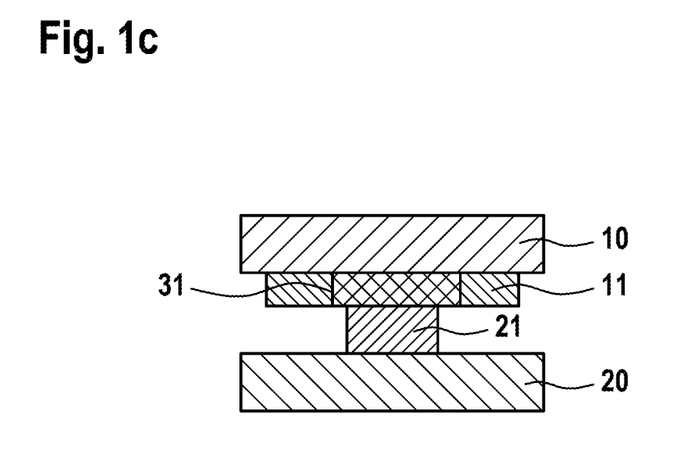

FIG. 1c shows the two elements 10 and 20 after the beginning of the bonding process during which the layer materials of the two starting layers 11 and 21 mix in a eutectic ratio. Bond front 31 expands laterally under the applied contact force. The material transportation associated with it results in a reduction of the overall thickness of the two starting layers. The interflowing layer material causes an additional force which contracts the two elements 10 and 20 and increases the applied contact force locally in the bonding area in this way.

Figure 1D:
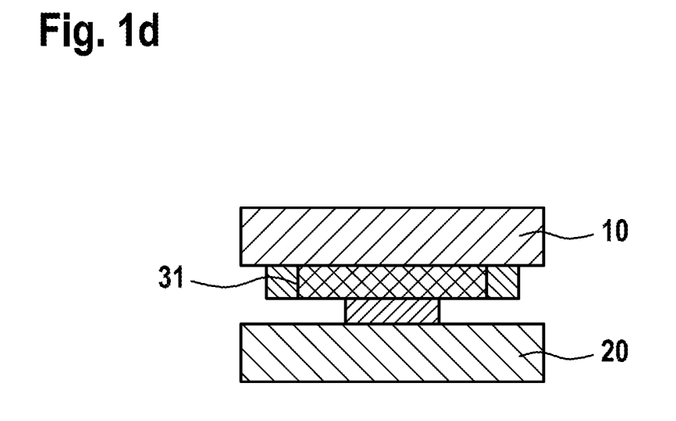

In the state of the bonding process illustrated in FIG. 1d, bond front 31 has progressed further laterally. The two elements 10 and 20 continue to be pressed together, original distance D0+d between elements 10 and 20 being further reduced.

Figure 1E:
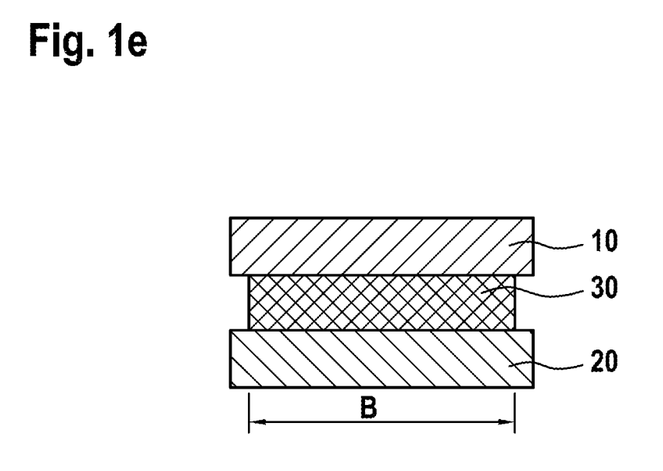

In FIG. 1e, the bonding process is completed. The entire layer material is distributed uniformly across entire bonding area 30 namely as far as areal extent and the eutectic composition are concerned which are required for the strived for stability of the bond. Bond 30 has thus reached its final areal extent and height in the present case.

Figure 2:
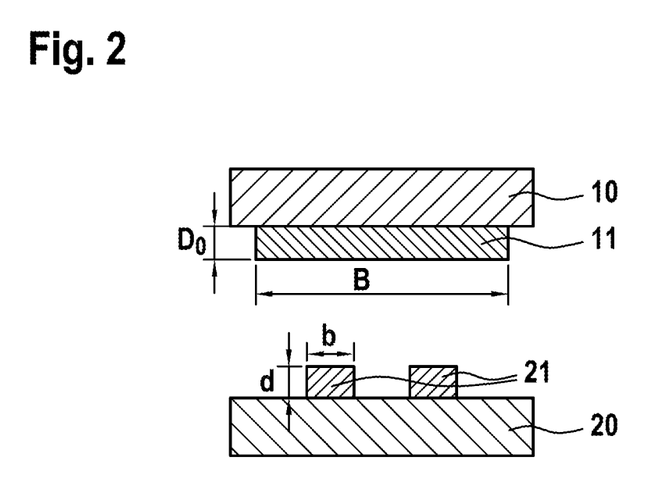
FIG. 2 shows a layout variant for a starting layer of this bonding process based on a schematic sectional representation.

FIG. 2 shows a layout variant for the two starting layers of a eutectic bond between two semiconductor elements 10 and 20, in this bond, a layer area 11 in the starting layer of element 10 being assigned multiple layer areas 21 in the starting layer on other element 20. Each of the layer thicknesses of the two starting layers or layer areas 11 and 21 were also selected here in such a way that the layer materials are available in the quantitative ratio necessary for the bond. This layout variant, for example, lends itself when a starting layer is only manufacturable having a limited layer thickness and/or when the lateral mixing or interflowing of the layer materials is limited during the bonding process, but also when the geometry of the bonding area requires this, e.g., in the case of a circumferential bond frame.

Figure 3A:
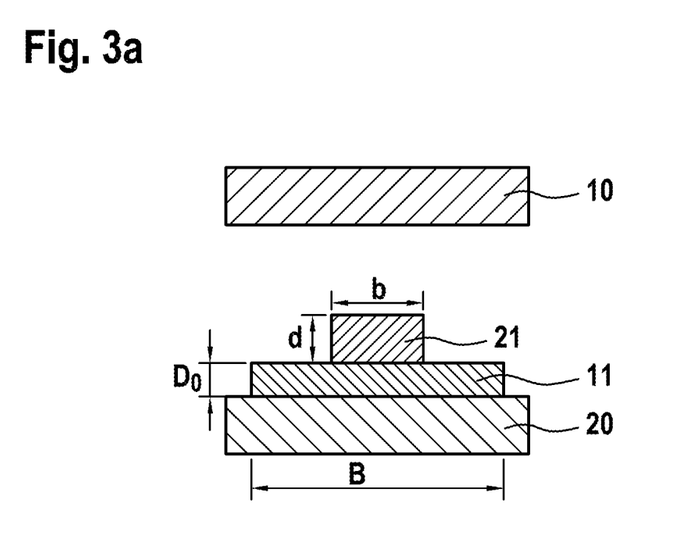
FIGS. 3a and 3b show other possibilities of applying the starting layers of the bonding process based on schematic representations.
Figure 3B:
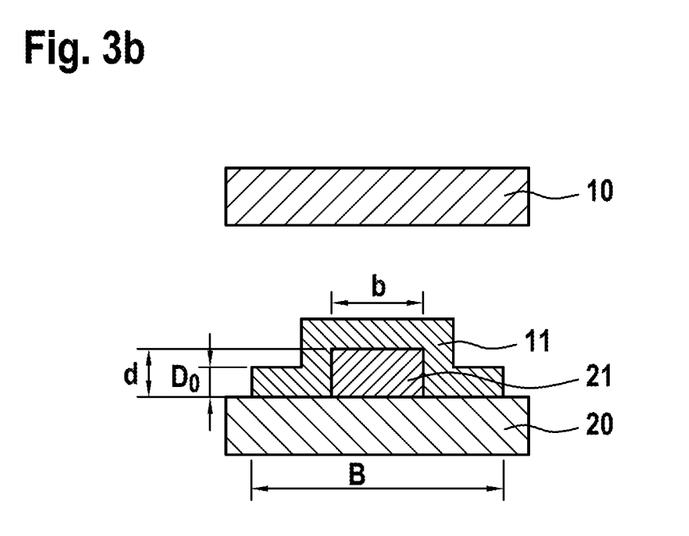

The two starting layers for the bond between two semiconductor elements 10 and 20 may also both be applied to one of the two element surfaces, which is illustrated by FIGS. 3a and 3b.

In the case of FIG. 3a, a first thinner starting layer was initially deposited and structured on element 20. The areal extent of resulting layer area 11 essentially corresponds in this case to the dimension of the bonding area to be generated.

A second thicker starting layer was then deposited and structured over the thus structured first starting layer. Resulting layer area 21 is situated centrally on layer area 11, but has a significantly smaller areal extent.

In contrast thereto, the thicker starting layer was initially deposited and structured on element 20 in the case of FIG. 3b. Thinner starting layer 11 was then deposited and structured above thus generated layer area 21. Since the element surface now has a not completely planar topography, the structuring of this thinner layer requires a little bit more effort. This variant is, however, advantageous when the material of lower layer 21 is slightly chemically corrosive, such as aluminum in the case of an Al—Ge bonding or silicon in the case of an Au—Si bond. With the aid of upper covering layer 11, the formation of bothersome surface oxides may be prevented in this case.

Figure 4A:
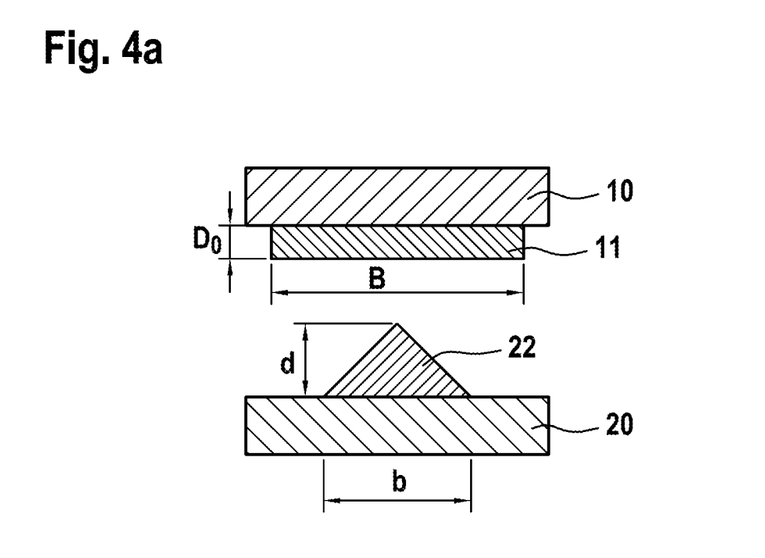
FIGS. 4a and 4b show starting layers for the bonding process which are provided with a topography.
Figure 4B:
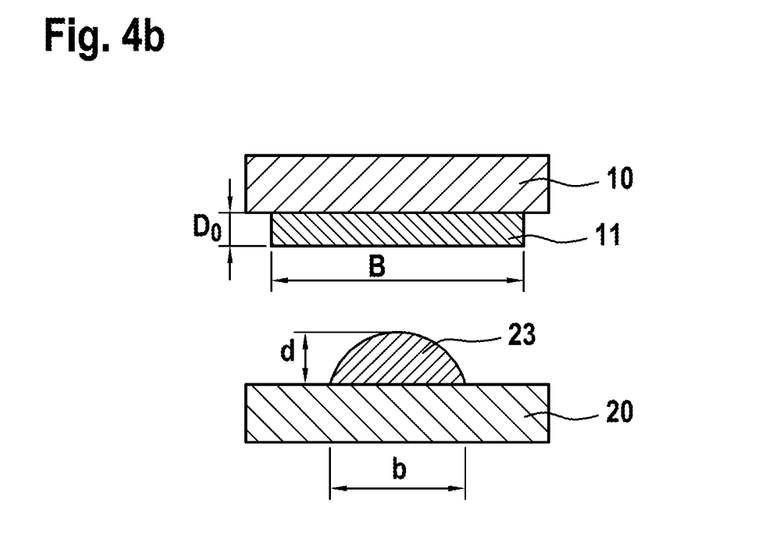

To reduce the contact area between the element surfaces to be bonded at the beginning of the bonding process, the flank profiles of the layer areas of the starting layers may also be influenced, for example, at least in the case of some layer materials, which is illustrated in FIGS. 4a and 4b.

FIG. 4a shows a layer area 22 having beveled flanks, for example. This flank profile may, for example, occur when the starting layer was structured in an isotropic etching step.

In the case of FIG. 4b, the flanks of layer area 23 are rounded. This flank profile may, for example, form when the starting layer was scraped in a screen printing process and the layer material then contracts due to surface tension, or when the structured starting layer is subsequently reshaped with the aid of fusion and solidification.

Figure 5A:
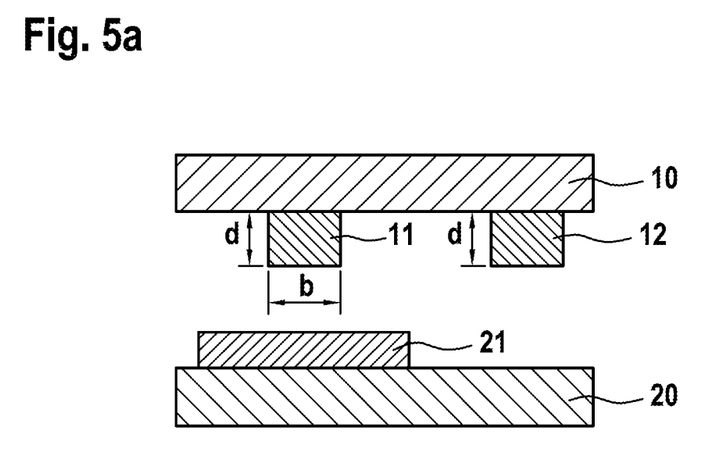
FIGS. 5a and 5b show the implementation of a standoff structure during the bonding process based on schematic representations.

As already mentioned above, the bonding layer generated according to the present invention is generally thinner than the sum of the layer thicknesses of the two starting layers. In one refinement of the present invention, this fact is used to provide the two element surfaces to be bonded to one another with structural elements which are situated very closely to the respective other element function and interact with it. These structural elements are simply formed in a starting layer for the bond, namely outside a bonding area. Depending on the material, electrodes for activation or the signal detection or also a standoff structure may be implemented, for example, as an overload protection, which is illustrated in FIGS. 5a and 5b.

In this exemplary embodiment described here, a layer area 21, the areal extent of which essentially corresponds to the strived for bonding area, was structured out of the starting layer of element 20. This layer area 21 is assigned a layer area 11 in the starting layer of element 10, the areal extent of which is considerably smaller than that of layer area 21. In turn, the starting layer of element 10 is, however, thicker than the starting layer of element 20 so that the quantitative ratio of the layer materials necessary for the eutectic bonding process is provided. Next to layer area 11 and outside the bond to be generated, a further layer area 12 was structured out of the starting layer of element 10. FIG. 5a illustrates the configuration of the two layer areas 11 and 12 as well as of layer area 21 and the corresponding layer thicknesses.

Figure 5B:
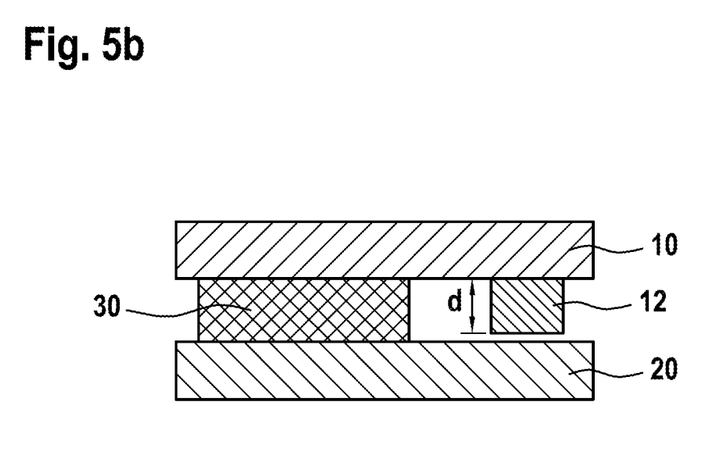

FIG. 5b shows the two elements 10 and 20 after the bonding process. The layer materials of layer areas 11 and 21 form bond 30, the thickness of this bonding layer 30 being smaller than the sum of the layer thicknesses of the two starting layers 11 and 21. The material and the thickness of layer area 12 on element 10 have not changed during the bonding process. This layer area 12 is used as a standoff structure which ensures a minimum distance between the two elements 10 and 20 and prevents a further compression of the bonding material.

What is claimed is:

1. A method for manufacturing a vertical hybrid integrated component, the method comprising:
   providing at least two semiconductor elements; and
   bonding the two elements to one another via a bond of at least one metallic starting layer and at least one further starting layer, at least one of the two element surfaces to be bonded being provided with the at least one metallic starting layer, out of which at least one first layer area is structured, at least one of the two element surfaces to be bonded being provided with at least one further starting layer, out of which at least one second layer area is structured which is situated so that it forms together with the first layer area of the first starting layer a bonding layer for the two elements during the bonding process, wherein the starting layers are structured so that the layer areas which are assigned to one another have differently sized areal extents and the layer thicknesses of the two starting layers are selected so that the layer areas which are assigned to one another meet the material ratio necessary for the bonding process;
   wherein the at least two semiconductor elements include at least one of: (i) at least two MEMS elements; at least two ASIC elements; and at least one MEMS element and at least one ASIC element, and
   wherein the elements of the vertical hybrid integrated component are situated above one another in the form of a chip stack and are bonded to one another.

2. The method of claim 1, wherein each of the two element surfaces to be bonded is provided with at least one starting layer.

3. The method of claim 1, wherein the two starting layers are consecutively deposited and structured on one of the two element surfaces to be bonded.

4. The method of claim 1, wherein a contiguous layer area of the metallic starting layer is assigned multiple layer areas of the further starting layer.

5. The method of claim 1, wherein the at least one layer area is tapered upwardly.

6. The method of claim 1, wherein at least one structural element, which is not assigned a layer area of the further starting layer, is structured out of at least one starting layer and this structural element is configured as an electrode or as a standoff structure.

* * * * *